US012228597B2

(12) United States Patent
Utamaru

(10) Patent No.: US 12,228,597 B2
(45) Date of Patent: Feb. 18, 2025

(54) MANAGEMENT SYSTEM AND MANAGEMENT METHOD

(71) Applicant: KYOCERA CORPORATION, Kyoto (JP)

(72) Inventor: Tsudoi Utamaru, Kawasaki (JP)

(73) Assignee: KYOCERA CORPORATION, Kyoto (JP)

( * ) Notice: Subject to any disclaimer, the term of this patent is extended or adjusted under 35 U.S.C. 154(b) by 502 days.

(21) Appl. No.: 17/456,643

(22) Filed: Nov. 29, 2021

(65) Prior Publication Data

US 2022/0082596 A1 Mar. 17, 2022

Related U.S. Application Data

(63) Continuation of application No. PCT/JP2020/020840, filed on May 27, 2020.

(30) Foreign Application Priority Data

May 30, 2019 (JP) ................. 2019-101680

(51) Int. Cl.
*G01R 21/00* (2006.01)
*G01R 21/133* (2006.01)
*G06Q 50/06* (2012.01)

(52) U.S. Cl.
CPC ........... *G01R 21/133* (2013.01); *G06Q 50/06* (2013.01)

(58) Field of Classification Search
None
See application file for complete search history.

(56) References Cited

U.S. PATENT DOCUMENTS

| 2017/0092102 A1 | 3/2017 | Fusakawa et al. |
| 2017/0116686 A1* | 4/2017 | Fujita ..................... H02J 3/322 |
| 2017/0261957 A1* | 9/2017 | Boettcher .............. G05B 15/02 |
| 2017/0302468 A1 | 10/2017 | Fujita et al. |
| 2020/0072881 A1 | 3/2020 | Akai et al. |

FOREIGN PATENT DOCUMENTS

| JP | 2012146265 A | 8/2012 |
| JP | 2015-87900 A | 5/2015 |
| JP | 2018181236 A | 11/2018 |
| JP | 2019-67462 A | 4/2019 |
| WO | 2017066425 A1 | 4/2017 |

* cited by examiner

*Primary Examiner* — Paul B Yanchus, III
(74) *Attorney, Agent, or Firm* — HAUPTMAN HAM, LLP

(57) ABSTRACT

In a management system, a management apparatus includes a detector configured to detect an operating status of a piece of electric equipment installed in a house, and a transmitter configured to transmit, to a first management server, operation information of the operating status detected by the detector. The first management server includes a receiver configured to receive the operation information from the management apparatus, and a calculator configured to calculate a responsivity index based on operation information of a piece of specific electric equipment among a plurality of the pieces of electric equipment, the responsivity index indicating a possibility that a user of the piece of electric equipment is capable of responding to an external request.

14 Claims, 5 Drawing Sheets

MANAGEMENT SYSTEM AND MANAGEMENT METHOD

RELATED APPLICATIONS

The present application is a continuation based on PCT Application No. PCT/JP2020/020840, filed on May 27, 2020, which claims the benefit of Japanese Patent Application No. 2019-101680 filed on May 30, 2019. The content of which is incorporated by reference herein in their entirety.

TECHNICAL FIELD

The present invention relates to a management system and a management method.

BACKGROUND ART

A technique has been known that determines whether a user is at home based on the temporal change of power consumption in a user's house and an operating status of at least one piece of electric equipment in the user's house (for example, see Patent Document 1).

CITATION LIST

Patent Literature

Patent Literature 1: JP 2018-181236

SUMMARY

A management system according to a first aspect of an embodiment of the present disclosure is a management system that includes a management apparatus and a first management server. The management apparatus includes a detector configured to detect an operating status of a piece of electric equipment installed in a house, and a transmitter configured to transmit, to the first management server, operation information of the operating status detected by the detector. The first management server includes a receiver configured to receive the operation information from the management apparatus, and a calculator configured to calculate a responsivity index based on operation information of a piece of specific electric equipment among a plurality of the pieces of electric equipment. The responsivity index indicates a possibility that a user of the piece of electric equipment is capable of responding to an external request.

A management method according to a second aspect of an embodiment of the present disclosure is a management method including detecting, by a management apparatus, an operating status of a piece of electric equipment installed in a house, transmitting, by the management apparatus, operation information of the operating status to a first management server, receiving, by the first management server, the operation information from the management apparatus, and calculating, by the first management server, a responsivity index based on operation information of a piece of specific electric equipment among a plurality of the pieces of electric equipment, the responsivity index indicating a possibility that a user of the piece of electric equipment is capable of responding to an external request.

DESCRIPTION OF EMBODIMENTS

Figure 1:
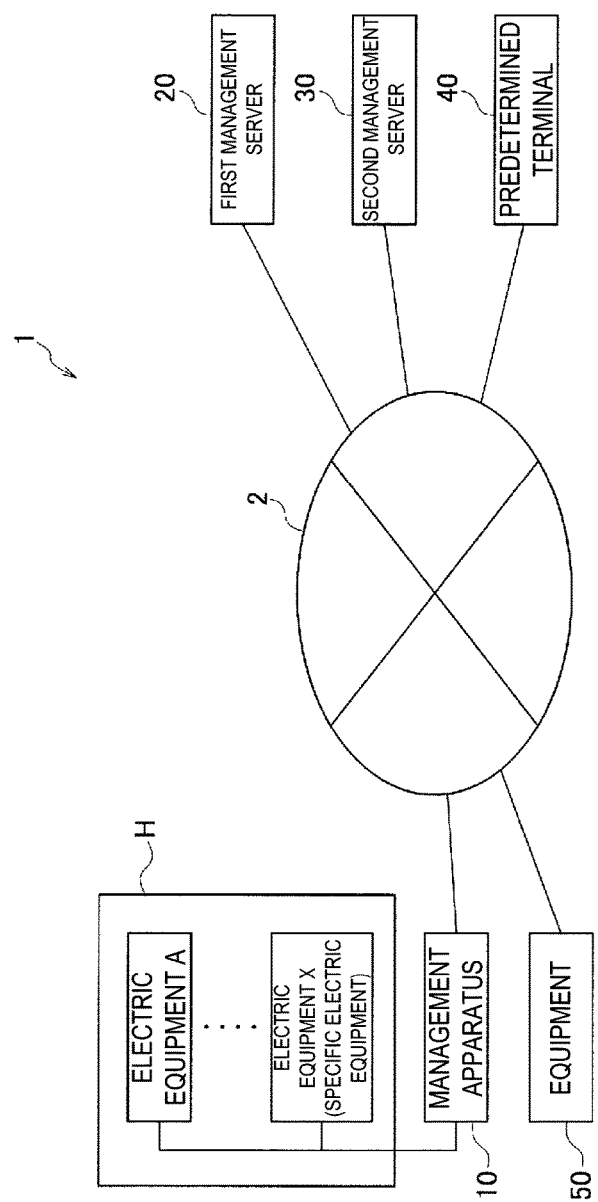
FIG. 1 is a diagram illustrating an example of an overall configuration of a management system 1 according to an embodiment.

In the technique described above, whether a user is at home is determined by using an operating status of electric equipment such as a vacuum cleaner, but whether a user can respond to an external request, such as a request to change delivery time of a delivery article from a delivery service provider, is not indicatable.

Thus, the present disclosure has been made in view of the above-described problem, and enables calculation of a possibility that a user is capable of responding to an external request.

A control system according to an embodiment of the present disclosure will be described below with reference to the drawings. Note that in the drawings used for the following description, the same or similar components are denoted with the same or similar reference numerals.

First Embodiment

A first embodiment of the present disclosure will be described below with reference to FIG. 1 to FIG. 4. FIG. 1 is a diagram illustrating an example of an overall configuration of a management system 1 according to the embodiment.

As illustrated in FIG. 1, the management system 1 includes pieces of electric equipment A to X installed in a house (or facility) H, a management apparatus 10, a first management server 20, a second management server 30, a predetermined terminal device 40, and a piece of equipment 50.

Here, the management apparatus 10, the first management server 20, the second management server 30, the predetermined terminal device 40, and the piece of equipment 50 are configured to be connectable to each other via a communication network 2. The communication network 2 may be a wired network or a wireless network.

The pieces of electric equipment A to X are pieces of equipment that consume power. Examples of the pieces of electric equipment A to X include air conditioning equipment, lighting equipment, a vacuum cleaner, audio visual (AV) equipment such as a television, a radio, or a DVD player, gaming equipment, a tablet terminal device, a personal computer (PC), and/or a piece of communication equipment such as a communication router.

The pieces of electric equipment A to X include a piece of specific electric equipment X. Here, the piece of specific electric equipment X is a type of electric equipment, and examples of the piece of specific electric equipment X include AV equipment, gaming equipment, and/or communication equipment. Examples of the piece of specific electric equipment may include entertainment equipment. Here, examples of the entertainment equipment include gaming equipment.

Here, the pieces of electric equipment A to X installed in the house (or facility) H are not necessarily limited to those installed in the house H to be fixed and may be those that are owned by a user and portable outside the house H. For example, such pieces of electric equipment A to X may be pieces of portable communication equipment such as smart phones and/or tablet terminal devices. Here, the "user" means a resident and/or a manager of the house.

Figure 2:
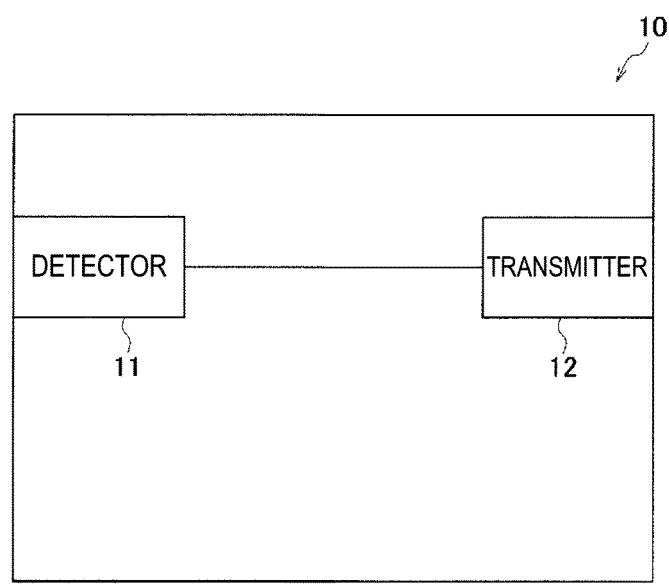
FIG. 2 is a diagram illustrating an example of functional blocks of a management apparatus 10 according to the embodiment.

The management apparatus 10 is an apparatus that manages power of at least one piece of electric equipment among the pieces of electric equipment A to X, and includes, for example, an energy management system (EMS). The EMS is an example of a virtual end node (VEN). As illustrated in FIG. 2, the management apparatus 10 includes a detector 11 and a transmitter 12.

The detector 11 is configured to detect the operating statuses of the pieces of electric equipment A to X installed in the house H.

Here, the detector 11 includes a control circuit such as a processor. The detector 11 may be configured to detect, based on power consumption of the pieces of electric equipment A to X, a state (ON state) in which the power supply of the pieces of electric equipment A to X is turned on, a state (OFF state) in which the power supply of the pieces of electric equipment A to X is turned off, and/or a state (sleep state) in which the pieces of electric equipment A to X standby in a sleep mode (power saving mode), as the operating statuses of the pieces of electric equipment A to X.

Alternatively, when the pieces of electric equipment A to X are pieces of communication equipment, the detector 11 may be configured to detect, based on the communication traffic of the pieces of electric equipment A to X, a state (ON state) in which the power supply of the pieces of electric equipment A to X is turned on, a state (OFF state) in which the power supply of the pieces of electric equipment A to X is turned off, and/or a state (sleep state) in which the pieces of electric equipment A to X standby in a sleep mode (power saving mode), as the operating statuses of the pieces of electric equipment A to X.

The transmitter 12 includes a communication module. The transmitter 12 is configured to transmit the operation information regarding the operating statuses of the pieces of electric equipment A to X, which are detected by the detector 11, to the first management server 20 via the communication network 2.

Here, the operation information includes the operating statuses of the pieces of electric equipment A to X, which are detected by the detector 11. The operation information may include information regarding start times in the operating statuses of the pieces of electric equipment A to X.

The operation information may include information indicating that the use of the piece of specific electric equipment X (or the entertainment equipment) has been started, and information indicating that the use of the piece of specific electric equipment X (or the entertainment equipment) has been terminated. The operation information may include information of time when the use of the piece of specific electric equipment X (or the entertainment equipment) has been started and information of time when the use of the piece of specific electric equipment X (or the entertainment equipment) has been terminated.

The operation information may also include information indicating that a sleep state of the piece of specific electric equipment X (or the entertainment equipment) has been started. The operation information may include information regarding the start time of the sleep state of the piece of specific electric equipment X (or the entertainment equipment) and information regarding the end time of the sleep state of the piece of specific electric equipment X (or the entertainment equipment).

Furthermore, the operation information may include power information regarding the power consumption of the piece of specific electric equipment X. For example, in response to the power consumption of the piece of specific electric equipment X has increased by a predetermined value, the operation information may include power information indicating that the power consumption of the piece of specific electric equipment X has increased. In addition, in response to the power consumption of the piece of specific electric equipment X has decreased by a predetermined value, the operation information may include power information indicating that the power consumption of the piece of specific electric equipment X has decreased.

The operation information may include communication traffic information regarding the communication traffic of the piece of specific electric equipment X (for example, the communication equipment). For example, in response to the communication traffic of the piece of specific electric equipment X has increased by a predetermined value, the operation information may include communication traffic information indicating that the communication traffic of the piece of specific electric equipment X has increased. In addition, in response to the communication traffic of the piece of specific electric equipment X has decreased by a predetermined value, the operation information may include communication traffic information indicating that the communication traffic of the piece of specific electric equipment X has decreased.

Figure 3:
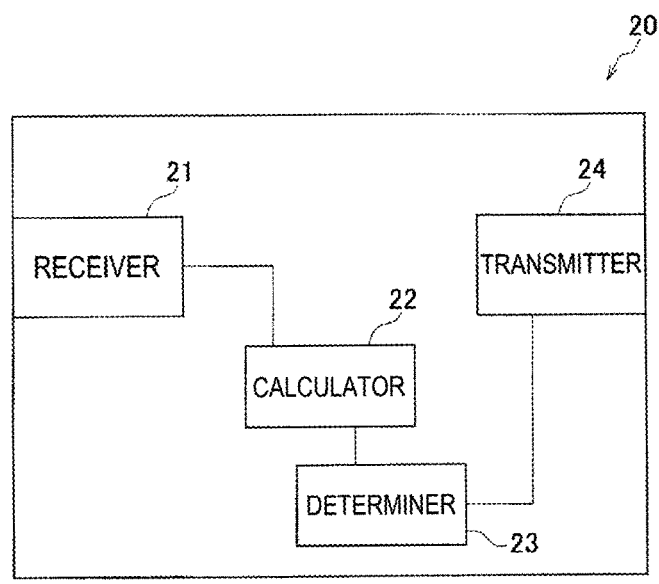
FIG. 3 is a diagram illustrating an example of functional blocks of a first management server 20 according to the embodiment.

As illustrated in FIG. 3, the first management server 20 includes a receiver 21, a calculator 22, a determiner 23, and a transmitter 24.

The receiver 21 includes a communication module and is configured to receive operation information from the management apparatus 10.

The calculator 22 includes a control circuit such as a processor. The calculator 22 is configured to calculate a responsivity index indicating a possibility that a user is capable of responding to an external request, based on a piece of operation information related to the piece of specific electric equipment X among pieces of operation information received by the receiver 21.

Here, in the embodiment, description will be made on the assumption that a higher value of the responsivity index corresponds to a higher possibility that the user is capable of responding to an external request. A lower value of the responsivity index may correspond to a higher possibility that the user is capable of responding to an external request.

For example, the external request may be a request to change delivery time of a delivery article from a delivery service provider, a request to provide labor such as housework, language lessons, and furniture assembly, a pet custody request, a request for deputy reception of a delivery article from a delivery service provider, a request to share a piece of communication equipment such as a communication router, and/or a request to share a parking lot.

The calculator 22 is configured to increase, in response to receiving, by the receiver 21, the operation information including information indicating that the use of the piece of specific electric equipment X has been started, the value of the responsivity index for the user at that time. The range of the increase of such a responsivity index value may be predetermined.

On the other hand, the calculator 22 is configured to decrease, in response to receiving, by the receiver 21, the operation information including information indicating that the use of the piece of specific electric equipment X has been terminated, the value of the responsivity index for the user at that time. The range of the decrease of such a responsivity index value may be predetermined.

The calculator 22 is configured to not change, in response to receiving, by the receiver 21, the operation information including information indicating that the sleep state of the piece of specific electric equipment X has been started, the value of the responsivity index of the user at that time.

The calculator 22 may be configured to calculate the above-described responsivity index based on the operation information of the entertainment equipment among pieces of specific electric equipment X.

Alternatively, the calculator 22 may be configured to calculate the responsivity index of the user based on the operation information further including power information regarding the power consumption of the piece of specific electric equipment X.

For example, the calculator 22 may be configured to increase, in response to receiving, by the receiver 21, the operation information including power information indicating that the power consumption of the piece of specific electric equipment X has increased, the value of the responsivity index for the user at that time. The range of the increase of such a responsivity index value may be predetermined.

On the other hand, the calculator 22 may be configured to decrease, in response to receiving, by the receiver 21, the operation information including power information indicating that the power consumption of the piece of specific electric equipment X has decreased, the value of the responsivity index for the user at that time. The range of the decrease of such a responsivity index value may be predetermined.

Alternatively, the calculator 22 may be configured to calculate the responsivity index of the user based on the operation information further including communication traffic information regarding the communication traffic of the piece of specific electric equipment X.

For example, the calculator 22 may be configured to increase, in response to receiving, by the receiver 21, the operation information including communication traffic information indicating that the communication traffic of the piece of specific electric equipment X has increased, the value of the responsivity index for the user at that time. The range of the increase of such a responsivity index value may be a predetermined width.

On the other hand, the calculator 22 may be configured to decrease, in response to receiving, by the receiver 21, the operation information including communication traffic information indicating that the communication traffic of the piece of specific electric equipment X has decreased, the value of the responsivity index for the user at that time. The range of the decrease of such a responsivity index value may be predetermined.

The determiner 23 include a control circuit such as a processor. The determiner 23 is configured to determine whether the user is capable of responding to an external request based on the responsivity index of the user.

Specifically, the determiner 23 is configured to determine, if the responsivity index of the user is greater than a predetermined threshold, that the user is capable of responding to an external request. On the other hand, the determiner 23 is configured to determine, if the responsivity index of the user is lower than the predetermined threshold, that the user is not capable of responding to an external request.

The transmitter 24 includes a communication module. The transmitter 24 is configured to transmit, when the determiner 23 determines that the user is capable of responding to an external request, a message including information indicating that the user is capable of responding to an external request, to at least one of the second management server 30 or the predetermined terminal device 40.

Here, the transmitter 24 may be configured to transmit the above-described message to at least one of the second management server 30 or the predetermined terminal device 40 by using an IF This Then That (IFTTT) service.

The transmitter 24 may be configured to transmit content data corresponding to the message transmitted to at least one of the second management server 30 or the predetermined terminal device 40, to at least one of the management apparatus 10 or the equipment 50 owned by the user.

The content data may be content data corresponding to the external request, and may be, for example, delivery information regarding delivery. The delivery information may include at least one of reception time when the user receives a delivery article, delivery time of the delivery article, and/or a request to change the delivery time of the delivery article.

The second management server 30 is an external server such as a server of a delivery service provider. The predetermined terminal device 40 is a terminal device associated with the second management server 30.

An example of an operation of the management system 1 according to the embodiment will be described with reference to FIG. 4.

Figure 4:
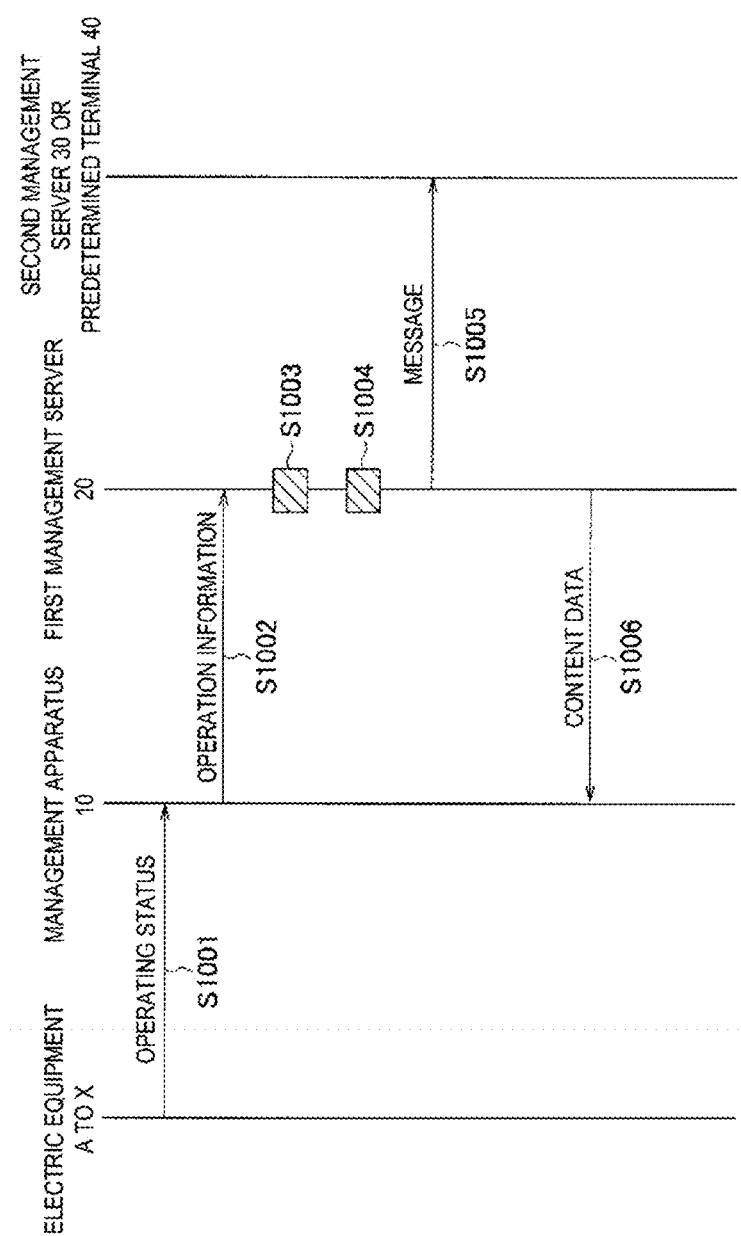
FIG. 4 is a sequence diagram illustrating an example of an operation of the management system 1 according to the embodiment.

As illustrated in FIG. 4, the management apparatus 10 detects the operating statuses of pieces of electric equipment A to X installed in a house H in step S1001, and transmits pieces of operation information regarding the operating statuses to the first management server 20 in step S1002.

In step S1003, the first management server 20 calculates a responsivity index indicating a possibility that a user is capable of responding to an external request, based on a piece of operation information related to the piece of specific electric equipment X among the received pieces of operation information. In step S1004, the first management server 20 determines whether or not the user is capable of responding to an external request based on the responsivity index of the user.

In step S1005, the first management server 20 transmits a message including information indicating that the above-described user is capable of responding to an external request, to at least one of the second management server 30 or the predetermined terminal device 40. In step S1006, the first management server 20 transmits content data corresponding to the message, to at least one of the management apparatus 10 or the equipment 50 owned by the user.

According to the management system 1 according to the embodiment, it is possible to calculate the possibility that a user is capable of responding to an external request.

Modifications

A modification according to the first embodiment described above will be described below with reference to FIG. 5, while focusing on differences from the first embodiment described above.

In the modification, each function of the first management server 20 described above may be configured to be implemented by the management apparatus 10. In this case, as illustrated in FIG. 5, the management apparatus 10 includes a detector 11, a calculator 22, a determiner 23, and a transmitter 24.

Figure 5:
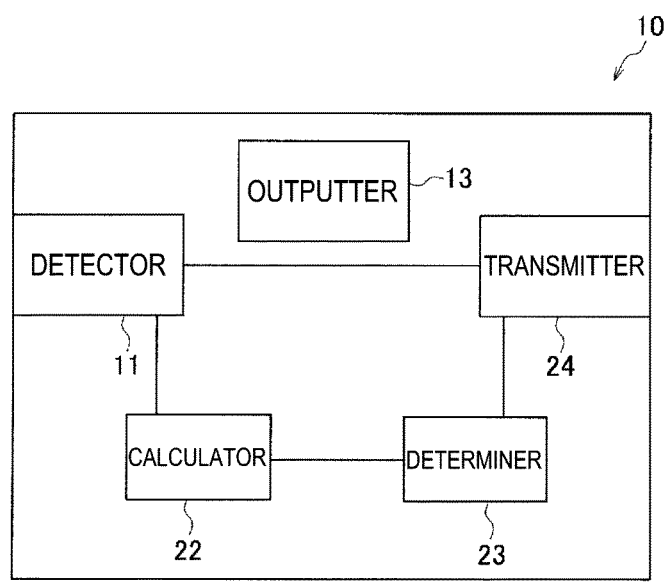
FIG. 5 is a diagram illustrating an example of functional blocks of a management apparatus 10 according to a modification.

As illustrated in FIG. 5, the management apparatus 10 may include an outputter 13. The outputter 13 may include a display, or may include a sound outputter. The outputter 13 may output content data.

For example, the transmitter 24 may be configured to transmit the above-described message to at least one of the second management server 30 or the predetermined terminal device 40 by using the IFTTT service, in response to the detector 11 detects that both a television and gaming equipment are used for 10 minutes or longer, based on power consumption of the television and the gaming equipment.

Alternatively, the transmitter 24 may be configured to transmit the above-described message to at least one of the second management server 30 or the predetermined terminal device 40 by using the IFTTT service, in response to the detector 11 detects that both a television and a DVD player are used for 10 minutes or longer, based on the power consumption of the television and the DVD player.

Alternatively, the transmitter 24 may be configured to transmit the above-described message to at least one of the second management server 30 or the predetermined terminal device 40 by using the IFTTT service, in response to the detector 11 detects that both gaming equipment and a communication router are used for 10 minutes or longer, based on the power consumption of the gaming equipment and the communication router.

Alternatively, the transmitter 24 may be configured to transmit the above-described message to at least one of the second management server 30 or the predetermined terminal device 40 by using the IFTTT service, in response to the detector 11 detects that the charging state of a communication terminal device continues for 10 minutes or longer and a communication router is used for 10 minutes or longer, based on the charging state of the communication terminal device and the power consumption of the communication router.

The invention claimed is:

1. A management system, comprising:
a management apparatus; and
a first management server, wherein
the management apparatus comprises:
    a detector configured to detect an operating status of a piece of entertainment equipment installed in a house; and
    a transmitter configured to transmit, to the first management server, operation information of the operating status;
the first management server comprises;
    a receiver configured to receive the operation information from the management apparatus; and
    a calculator configured to calculate a responsivity index based on the operation information of the operating status of the piece of entertainment equipment, the responsivity index indicating a possibility that a user of the piece of entertainment equipment is capable of responding to an external request, and
    the calculator is configured to increase a value of the responsivity index in response to detecting that the piece of entertainment equipment is used for longer than a predetermined time.

2. The management system according to claim 1, wherein the calculator is configured to:
    decrease the value of the responsivity index in response to receiving, by the receiver, the operation information including information indicating that use of the piece of entertainment equipment has been terminated.

3. The management system according to claim 1, wherein the calculator is configured not to change the value of the responsivity index in response to receiving, by the receiver, the operation information including information indicating that the piece of entertainment equipment has started to standby in a sleep state.

4. The management system according to claim 1, wherein the first management server further includes a determiner configured to:
    determine that the user is capable of responding to the external request in response to the value of the responsivity index being greater than a predetermined threshold; and
    determine that the user is not capable of responding to the external request in response to the value of the responsivity index being lower than the predetermined threshold.

5. The management system according to claim 4, wherein the first management server further includes a transmitter configured to transmit, to at least one of a second management server or a predetermined terminal device associated with the second management server, a message including information indicating that the user is capable of responding to the external request in response to determining that the user is capable of responding to the external request.

6. The management system according to claim 1, wherein the calculator is configured to calculate the responsivity index based on the operation information further including power information of power consumption of the piece of entertainment equipment.

7. The management system according to claim 6, wherein the calculator is configured to:
    increase the value of the responsivity index in response to receiving, by the receiver, the operation information including information indicating that the power consumption of the piece of entertainment equipment has increased; and
    decrease the value of the responsivity index in response to receiving, by the receiver, the operation information including information indicating that the power consumption of the entertainment equipment has decreased.

8. The management system according to claim 1, wherein the calculator is configured to calculate the responsivity index further based on operation information of an operation status of a piece of communication equipment installed in the house, the operation information of the operation status of the piece of communication equipment including communication traffic information of communication traffic of the piece of communication equipment.

9. The management system according to claim 8, wherein the calculator is configured to:
    increase the value of the responsivity index in response to receiving, by the receiver, the operation information including the communication traffic information indicating that the communication traffic of the piece of communication equipment has increased; and
    decrease the value of the responsivity index in response to receiving, by the receiver, the operation information including the communication traffic information indicating that the communication traffic of the piece of communication equipment has decreased.

10. The management system according to claim 5, wherein
 the transmitter is configured to transmit the message to at least one of the second management server or the predetermined terminal device by using an IF This Then That (IFTTT) service.

11. The management system according to claim 5, wherein
 the transmitter is configured to transmit content data corresponding to the message to at least one of the management apparatus or a piece of equipment owned by the user.

12. The management system according to claim 1, wherein
 the external request includes a request from an external provider to change a time schedule.

13. The management system according to claim 1, wherein
 the external request includes a request from an external provider to change a delivery time of a delivery article.

14. A management method, comprising:
 detecting, by a management apparatus, an operating status of a piece of entertainment equipment installed in a house;
 transmitting, by the management apparatus, operation information of the operating status to a first management server;
 receiving, by the first management server, the operation information from the management apparatus; and
 calculating, by the first management server, a responsivity index based on the operation information of the piece of entertainment equipment, the responsivity index indicating a possibility that a user of the piece of entertainment equipment is capable of responding to an external request,
 wherein the management method further comprises increasing a value of the responsivity index in response to detecting that the piece of entertainment equipment is used for longer than a predetermined time.

* * * * *